United States Patent
Solimene

(10) Patent No.: US 6,442,072 B2
(45) Date of Patent: Aug. 27, 2002

(54) ROW SELECTION CIRCUIT FOR FAST MEMORY DEVICES

(75) Inventor: Raffaele Solimene, Sorrento (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/745,286

(22) Filed: Dec. 21, 2000

(30) Foreign Application Priority Data

Dec. 21, 1999 (IT) .......................................... VA/99/0037

(51) Int. Cl.$^7$ ............................................... G11C 11/34
(52) U.S. Cl. .............................. 365/185.23; 365/230.06
(58) Field of Search ........................ 365/230.06, 185.23

(56) References Cited

U.S. PATENT DOCUMENTS 4,912,678 A  *  3/1990 Mashiko ..................... 365/222

FOREIGN PATENT DOCUMENTS

JP           0030190   *  2/1982   ........... G11C/11/34

OTHER PUBLICATIONS

Betty Prince, "Semiconductor Memories", 1983, Wiley, 2$^{nd}$ edition, pp. 164–165.*

* cited by examiner

Primary Examiner—M. Tran
(74) Attorney, Agent, or Firm—Lisa K. Jorgenson; Allen, Dyer, Doppelt, Milbrath & Gilchrist P.A.

(57) ABSTRACT

The selection/deselection circuit is for non-volatile memory word lines having a decoding line connected between a supply voltage and ground, and including a series of decoding transistors of the same conductivity controlled by respective selection signals and at least a load transistor whose conductivity is opposite to the conductivity of the decoding transistors in series with the series of transistors and biased by a control voltage. The load transistor produces an activating or deactivating voltage of a memory word line, and a circuit for controlling the load transistor is provided. Such an auxiliary control circuit includes a sensing element in series with the decoding transistors and the load transistor for producing a sensing signal switching between a first value when only one memory line is actually selected and a second value when multiple memory word lines appear to be simultaneously selected.

16 Claims, 4 Drawing Sheets

ROW SELECTION CIRCUIT FOR FAST MEMORY DEVICES

FIELD OF THE INVENTION

The present invention relates to the field of semiconductor memory devices, and, more particularly, to circuits for the selection of memory rows during high speed read operations.

BACKGROUND OF THE INVENTION

In semiconductor memory devices there are circuits for selecting and deselecting addressed memory cells. In general, these circuits are as illustrated in FIG. 1 and include a pair of functional blocks, namely ROW_DECODING and COL_DECODING, which stimulate respectively a certain row and a certain column of the memory matrix, corresponding to an externally provided address. The following description will refer to FLASH memories, however, the present invention may also be satisfactorily used in any type of non-volatile memory device.

The reading of data stored in the cells of a FLASH memory is performed by the SENSING block, that measures the current that circulates in the selected cells. If this current exceeds a certain value, the cell is regarded as non-programmed (not written) otherwise it is regarded as programmed (written). To correctly carry out the reading operations in a correctly carry out the reading operations in a sequential manner, the transient currents caused by a preceding selection of a memory row should disappear before selection of a different memory row is initiated.

A particular mode of memory access, known as a fast reading process, includes driving the selection of a new memory row when the previously selected row has not yet been deselected. This mode of memory access that allows for the selection of a memory row while the transients of the previously selected row are not yet decayed allows for a relevant saving of time and therefore an increment of the speed of the device though considerably increasing the risk or erroneous readings of stored bits.

In FLASH memory devices, the reading of stored bits is carried out by measuring the current that flows through the selected cells. If the current through a cell exceeds a pre-established value, the cell is read as not programmed or otherwise as programmed. During a fast reading process, at the start of a new selection, the memory word line (physically connected to the gates of the memory cells of the selected row) relative to the preceding reading may not yet be completely deselected. Therefore, if the new reading operation is carried out while there is still a transient current flowing through a deselected cell (bitline), the SENSING circuit would sense such a current contribution and could erroneously recognize a programmed cell as a non programmed one.

In other words, the fast reading process may involve the risk of the SENSING block being influenced by transient current still flowing in the cell of the row that had been previously selected, beside the current that circulates in the currently selected cell, thus producing erroneous readings.

To better explain this problem related to fast reading processes, a typical case in which a programmed FLASH cell may be erroneously read as a non-programmed cell will be discussed below. A typical time diagram of the main signals involved in a fast reading process is depicted in FIG. 2. During a first reading phase of the X row of the memory (FIRST READING), driven by the logic signal SELECT_ROW_X, the enabling voltage of the memory row ROW_X_(V) increases up to a certain value. Simultaneously, the current circulating through the cells of the selected ROW_X_(I) increases up to a certain value, which is eventually sensed when the logic signal SENSING_X is enabled, thus identifying for example the X cell of the row as a non-programmed cell.

When SELECT_ROW_X switches low, the X row is deselected. However, as it may be noticed, owing to the transients existing in the selection/deselection circuit, the voltage ROW_X_(V) of the deselected memory row X does not reach the zero value immediately but has a certain decay time. During part of this interval, the cells of the X row may remain enabled, implying the existence of a current ROW_X_(I) even if the signal SELECT_ROW_X is low, and such a current contribution may cause an erroneous subsequent reading (SECOND READING). In fact, the subsequently addressed memory row is enabled by the pulse SELECT_ROW_Y switching high when SELECT_ROW_X switch low (i.e. a fast reading is being performed), then when the sensing logic signal SENSING_Y is enabled, an OVERLAP_X+Y_(I) current is perceived whose value equals the sum of the contributions of the deselected ROW_X_(I) and of the current ROW_Y_(I) flowing in the selected cell of row Y.

Hence, such a sum of currents will be different from the contemplated current ROW_Y_(I) (which in the present example is null) thus causing the selected cell of row Y to be sensed as a non-programmed cell. This inconvenience requires a substantially complete decay of the deselection transients before proceeding to the selection and reading on a different word line, thus practically jeopardizing the speed advantages of a fast reading process.

Therefore, a fast deselection of word lines becomes an indispensable requisite in order to reduce the access time of the memory. It is therefore evident that a circuit capable of minimizing the duration of deselection transients on the word line of a nonvolatile FLASH memory to avoid erroneous readings during a fast reading process is desired. Moreover, the approach to the above discussed deselection problem should not penalize the selection time and be implemented with a limited number of additional components for an attendant requisite of minimizing silicon area requirements.

SUMMARY OF THE INVENTION

In view of the above, the present invention provides a circuit capable of overcoming the row deselection problem during a fast reading process without increasing selection time nor the occupied silicon area.

More precisely, a feature of the invention is a row selection/deselection circuit for a nonvolatile memory including a decoding line connected between a supply voltage and ground composed of a series of decoding transistors of the same type of conductivity controlled by respective selection signals and at least a load transistor of opposite type of conductivity connected in series to the decoding transistors and biased by a control voltage, having a current terminal coupled to the supply voltage and the other current terminal connected to the last one of the series of decoding transistors, onto which an activating or deactivating voltage signal of a word line of the memory array is produced.

The circuit of the invention further comprises a circuit for controlling the load transistor including a sensing element in series with the decoding transistors and the load transistor producing a sensing signal switching between a first level when only one memory word line is selected and a second level when more than one memory word line is selected, an inverter input with the sensing signal and outputting a first signal, and a high pass filter input with the first signal and producing a transient control voltage suitable to bring transitorily the load transistor to a state of full conduction when the sensing signal switches from the first to the second level.

BRIEF DESCRIPTION OF THE DRAWINGS

The various aspects and advantages of the circuit of the invention will become clearer through the following description of a preferred embodiment and by referring to the attached drawings wherein:

FIG. 5b is a schematic diagram illustrating an embodiment of the circuit of FIG. 5a.

DETAILED DESCRIPTION OF THE PREFERRED EMBODIMENTS

The problems caused by erroneous detections during a fast reading process are overcome by the present invention that provides a relatively simple selection/deselection circuit for the word lines of a memory cell array using the same control signals that normally are used in any conventional selection/deselection circuit.

Figure 1:
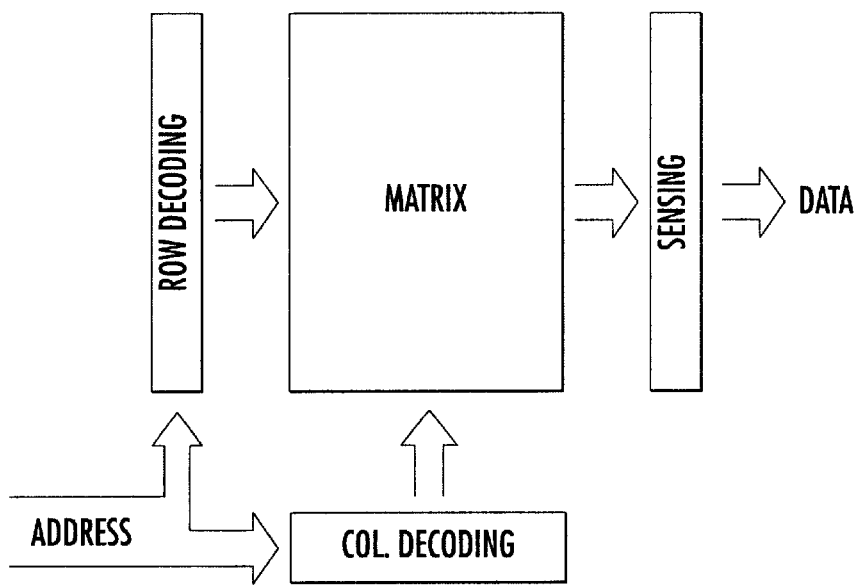
FIG. 1 is a schematic diagram illustrating the basic scheme of a selection circuitry of the cells of a memory array.
Figure 2:
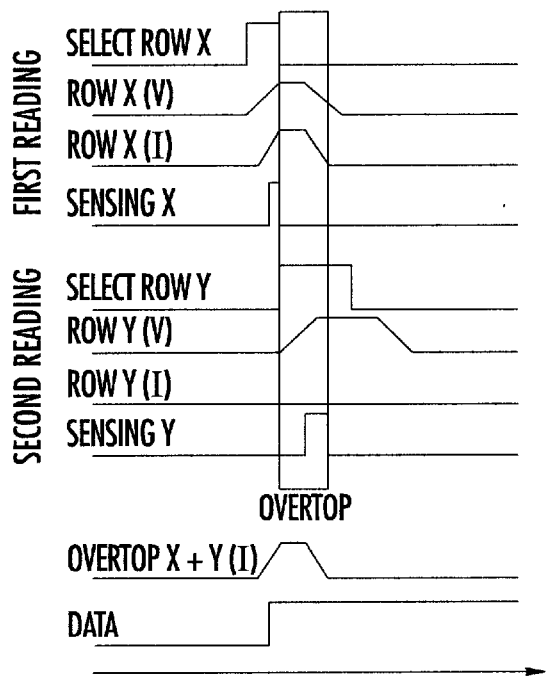
FIG. 2 is a time diagram of the main signals involved in a typical fast reading process with a common selection/deselection circuit.
Figure 3:
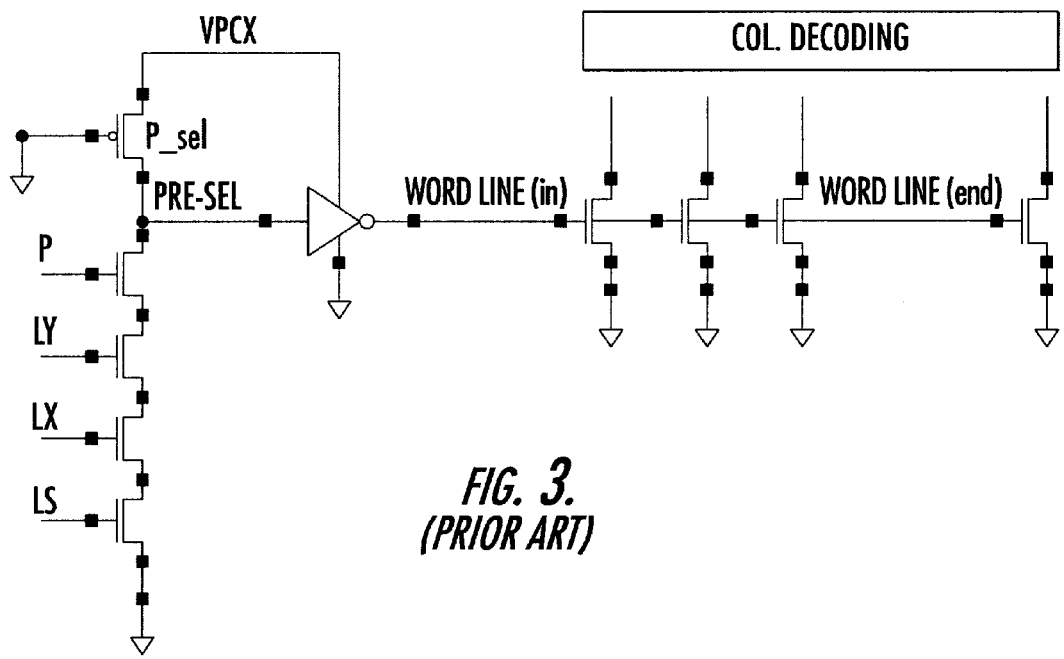
FIG. 3 is a schematic diagram illustrating the typical scheme of a common selection/deselection circuit of the prior art.

The operation of the circuit of the invention will be explained better by referring to a conventional selection circuit as shown in the example of FIG. 3. The circuit includes a decoding line having a series of decoding transistors (P, LY, LX, LS), to which are applied respective control signals that identify the memory row (word line) to be selected according to the hierarchy scheme of FIG. 4, and of a load transistor P_SEL whose type of conductivity is opposite to that of the decoding transistors. When a memory word line is deselected, the transistor P_SEL reaches a full conducting state making the voltage PRE_SEL the closest to the VPCX voltage as possible. In this instance, the inverter will output a voltage suitable to turn-off the cells.

The size of the load transistor P_SEL is very important: the load transistor should be sufficiently resistive to not slow down the selection while it should be highly conductive during a deselection phase. By increasing the W/L ratio, that is the ratio between the width and the length of the channel of the P_SEL transistor, a faster decay of the deselection transients of the cells may be obtained. However, together with a desired greater speed of the deselection process, this expedient produces two undesired effects: 1) a considerable increase of the space occupied by the decoding circuit, to be positioned along with the memory cell array; and 2) an increase of the low level of PRE-SEL when the row is selected.

This increases the total current flowing through the decoding transistors with the consequent lowering of the VPCX voltage. This lowering of VPCX may not be tolerated because the VPCX voltage, obtained elsewhere in the device by employing a pump circuit, must satisfy stringent stability requirements and be regulated to always read the cells at the same gate voltage.

Figure 5A:
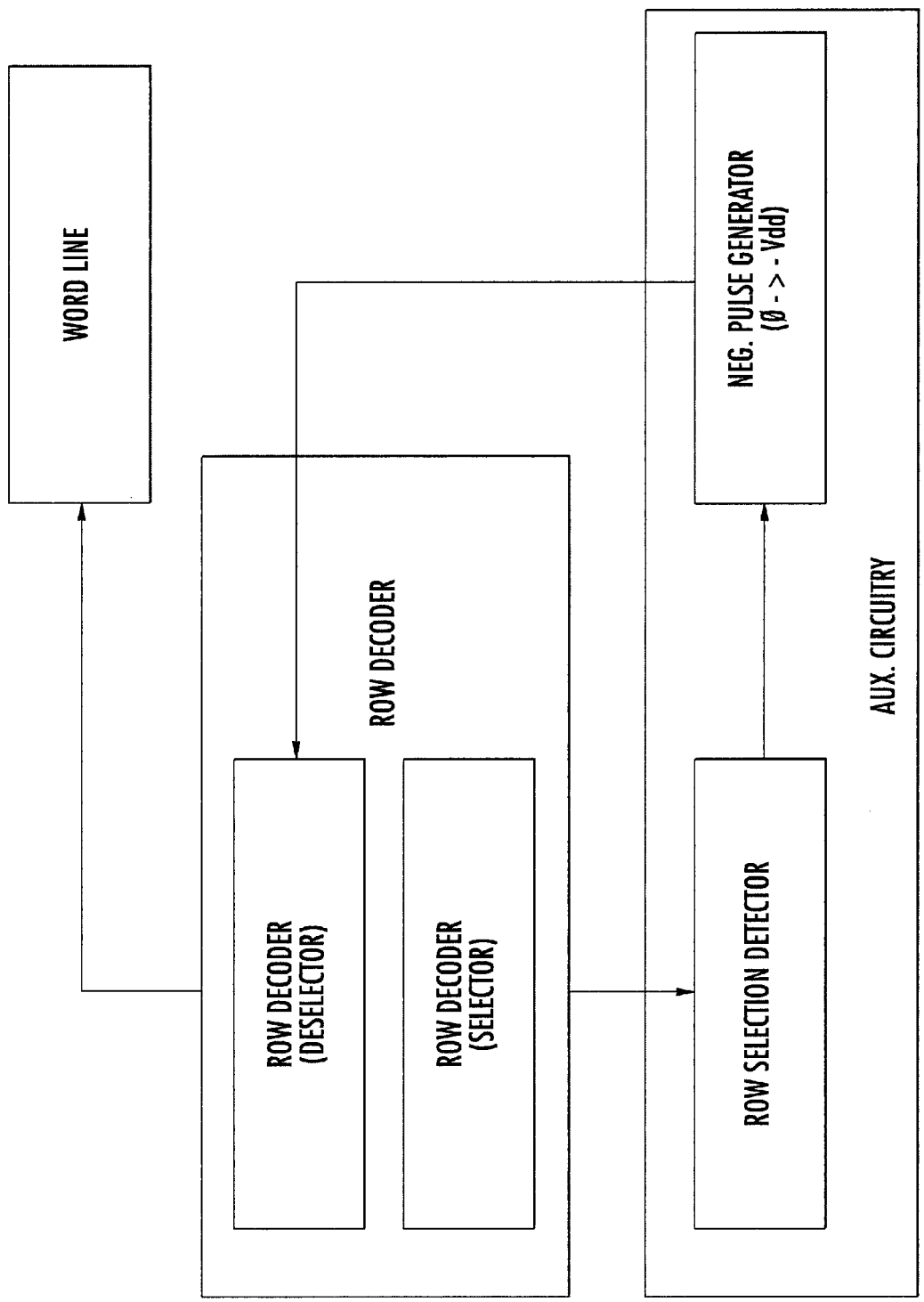
FIG. 5a is a schematic diagram illustrating the circuit according to the present invention.
Figure 5B:
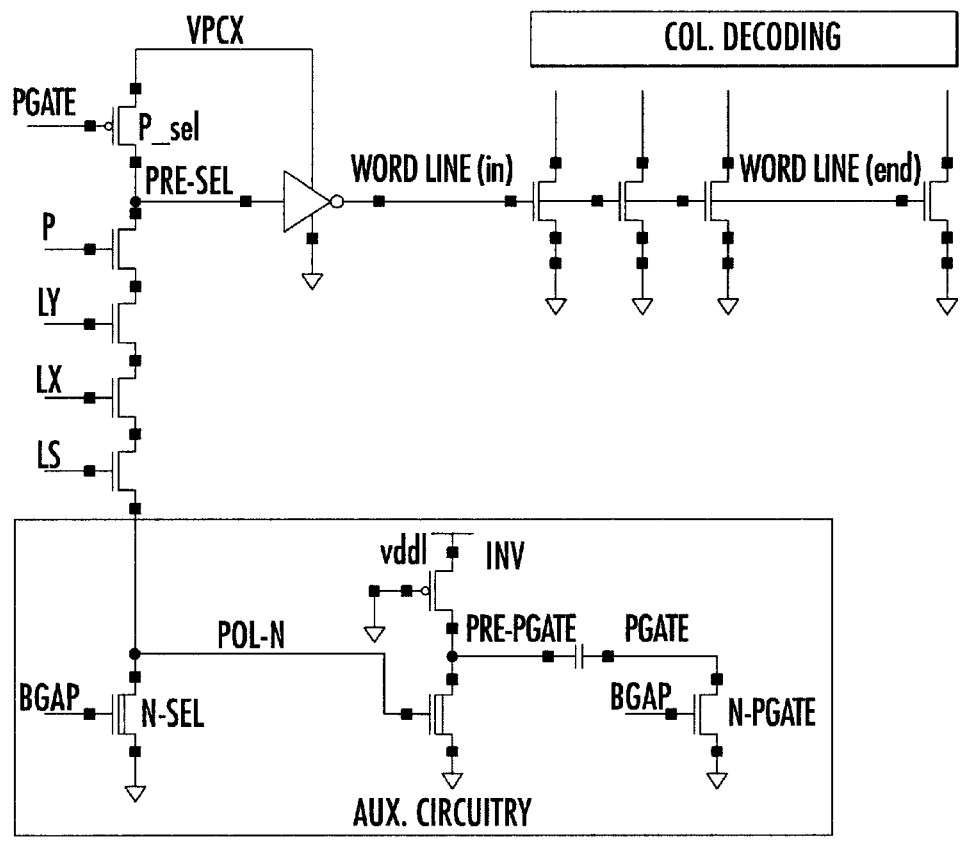

These drawbacks are avoided by using a selection circuit according to the diagram shown in FIG. 5a, which includes a circuit for detecting selection operation ROW_SELECTION_DETECTOR that drives the generation of a voltage pulse. Such a pulse forces the load transistor P_SEL to a state of deep conduction effectively shortening the transients. A circuit of the block diagram depicted in FIG. 5a is represented in FIG. 5b. The selection/deselection circuit of FIG. 5b, in comparison to the circuit of FIG. 3, has a special auxiliary circuitry AUX_CIRCUITRY for controlling the load transistor P_SEL.

The control circuit AUX_CIRCUITRY is substantially comprised of a sensing element N_SEL electrically connected in series to all the decoding lines of a certain memory sector on which develops a sense signal POL_N, and by an inverter INV input with the sense signal POL_N that outputs a certain voltage PRE_GATE, and a high pass filter input with the voltage PRE_PGATE and producing a transient control voltage PGATE for momentarily bringing the load transistor P_SEL to a state of full conduction.

A feature of the invention is that, while a fast reading process is in progress, the current flowing in the sensing transistor N_SEL may be larger than the current that would circulate in it when only one word line is actually selected because two word lines may appear to be selected until the transient currents in cells of the would be deselected word line have decayed. Therefore, during a fast reading process there will be a transitory increase of the voltage POL_N on the sensing device N_SEL. This voltage increase is used to establish whether a fast reading process is taking place or not and in a positive case to implement countermeasures to avoid the above mentioned problems.

In particular, referring to the embodiment of FIG. 5b, the control circuit of the invention may include: a natural NMOS transistor, N_SEL, kept in conduction state by a voltage BGAP, electrically connected in series to the selection transistor NMOS of a row decoding line to produce a current sensing signal POL_N. This transistor N_SEL is in common to all the decoding "half-nand" of the same sector of the memory array; and a coupling capacitance connected between the PRE_GATE output of the inverter INV and the PGATE signal node of the high pass filter stage formed with a natural transistor N_PGATE functionally coupled between the PGATE node and ground.

The circuit of FIG. 5b has the following characteristics: the control terminal of the P_SEL transistor is coupled to ground through the PMOS N_PGATE; the band-gap voltage BGAP that keeps the transistors N_SEL and N_PGATE in conduction state is intrinsically stable and is normally available in conventional non-volatile memory devices (its value is about 1.27 V).

During a fast reading process that entails the stimulation of word lines of the same sector, a sudden increase of the current through N_SEL is observed. This generates an increase of its drain voltage which, being input to the inverter INV (the NMOS transistor of which is a natural MOS), implies the switching Vdd→0 of the PRE_GATE output. By way of a capacitive coupling, the PGATE signal is brought instantaneously to a negative value (in theory to −Vdd), thus increasing the current absorbed by the load transistor P_SEL. Such a sudden increase of current absorption produces an outstanding reduction of the deselection time of the old word line without influencing the selection of the new word line.

Figure 6:
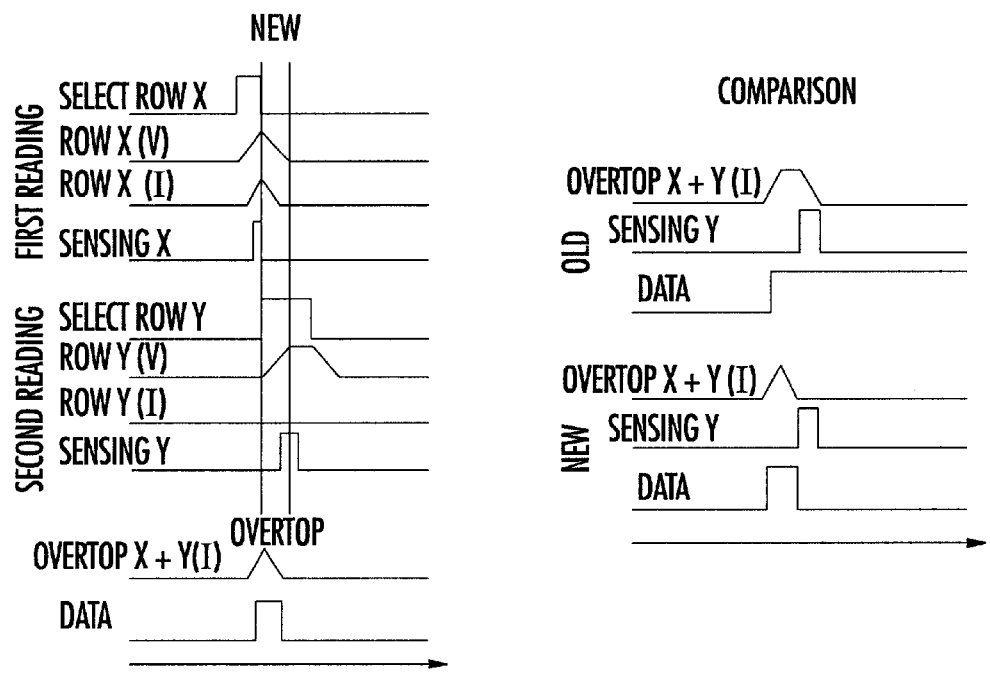
FIG. 6 is a timing diagram illustrating a comparison of the waveforms of the main signals involved in a fast reading process in a traditional selection/deselection circuit and in the circuit of the present invention of FIG. 5b.

As it may be observed in FIG. 6, the circuit of the invention is characterized in that the stimulation voltage of the deselected memory row ROW_X_(V) decreases immediately when the activating logic signal SELECT_ROW_X switches low, thus immediately reducing the current ROW_X_(I) that circulates in the cells of the row. Hence, even when a fast reading process is carried out, the current ROW_X_(I) is practically null before the switching of the logic signal SENSING_Y of the new selected row Y. This substantially reduces the risk of erroneous readings.

Figure 4:
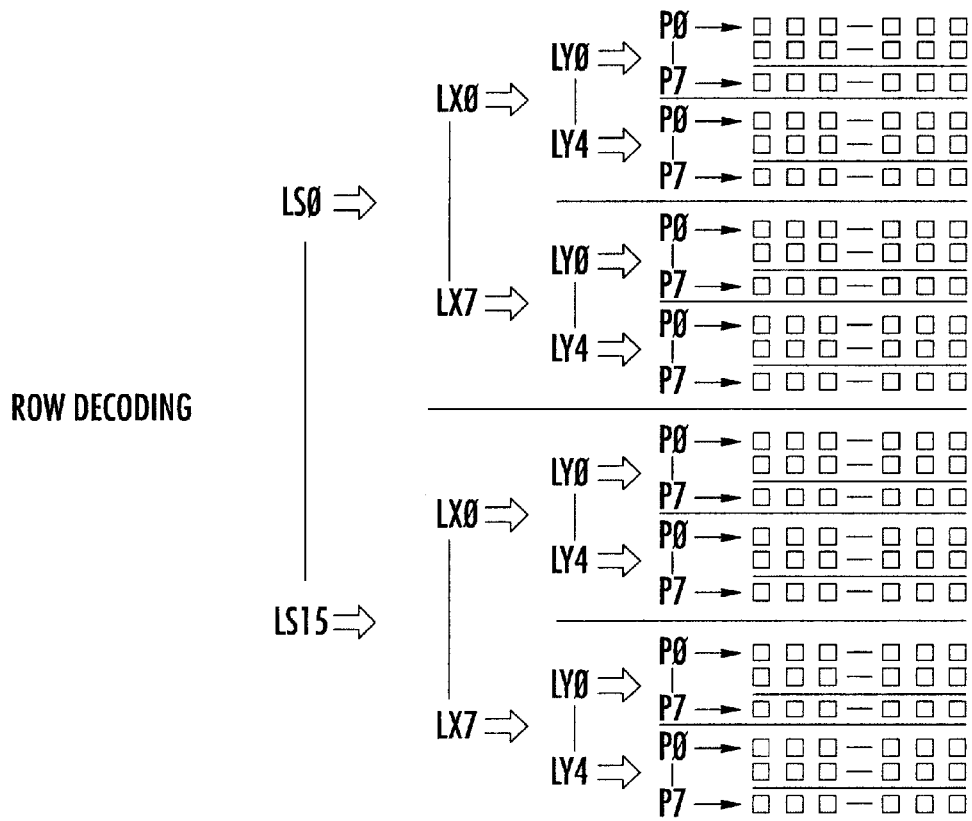
FIG. 4 is a schematic diagram showing the hierarchy of the decoding transistors.

Besides its effectiveness, the circuit of the invention has the following advantages: it is completely self-consistent because its functioning does not depend from an external timing circuit but on the actual row selection/deselection; given the hierarchical organization of FIG. 4, the auxiliary circuitry of the invention is unique for a whole sector; and when carrying out a fast reading process, after the brief initial transient, the voltage drop on the N_SEL transistor is negligible (≈0.1 V), the low level of the PRE-SEL signal (when the row is selected) remains practically unchanged, the whole absorbed current from the voltage pump circuit VPCX is unchanged and the inverter INV is off.

The advantages of the invention may be better appreciated by referring to the table presented hereinbelow showing a comparison of performance between the following: circuit (A) of FIG. 3 with a certain W/L ratio of the load transistor P_SEL; the same circuit (B) of FIG. 3 but with a greater W/L ratio of the load transistor P_SEL; circuit (C) of the invention of FIG. 5b, in which the load transistor P_SEL has the same W/L ratio of the circuit (A).

For all cases the table reports the W/L ratio of P_SEL, the current I absorbed when a word line is selected, the selection time Tsel (ns) and the deselection time Tdesel (ns) from the switching instant of the respective decoding signal to the actual selection/deselection of the word line.

TABLE 1

COMPARISON TABLE @ T = −40C, Vdd = 6 V

|  | circuit (A) | Circuit (B) | Circuit (C) |
| --- | --- | --- | --- |
| W/L | 2.2/2.3 | 6.5/2.3 | 2.2/2.3 |
| I [μA] | 110 | 340 | 110 |
| Tsel [ns] | 13.1 | 13.2 | 13.2 |
| Tdesel [ns] | 9.8 | 5.8 | 5.8 |

As it may be readily observed, for the same deselection time, the circuit (C) of the invention allows the use of a load transistor P_SEL of smaller area and absorbing a lower current, while for the same current, there is a remarkable reduction of the deselection time.

That which is claimed is:

1. A row selection/deselection circuit for a nonvolatile memory comprising:
   a decoding line connected between a voltage supply and ground, and comprising
      a series of decoding the same-conductivity-type transistors controlled by respective selection signals, and
      a load transistor of opposite type of conductivity connected in series to the decoding transistors and biased by a control voltage, and having a terminal coupled to the voltage supply and another terminal connected to a last one of the series of decoding transistors, and for generating an activating/deactivating voltage signal of a word line of the memory; and
   a circuit for controlling the load transistor comprising
      a sensing element in series to the decoding transistors and to the load transistor for producing a sensing signal which switches between a first level when only one memory word line is selected and a second level when a plurality of memory word line are selected;
      an inverter for receiving the sensing signal and outputting a first signal; and
      a high pass filter for receiving the first signal and producing the control voltage to bring the load transistor to a fully conductive state when the sensing signal switches from the first level to the second level.

2. A row selection/deselection circuit according to claim 1, wherein the high pass filter comprises a capacitor coupled to a resistive load for producing the transient control voltage.

3. A row selection/deselection circuit according to claim 2, wherein the resistive load comprises a second load transistor biased in a state of conduction with a band-gap voltage.

4. A row selection/deselection circuit according to claim 1, wherein the sensing element comprises a transistor biased in state of conduction with a band-gap voltage.

5. A row selection/deselection circuit for a nonvolatile memory comprising:
   a voltage supply;
   a reference voltage;
   a decoding line connected between the voltage supply and the reference voltage, and comprising
      a plurality of decoding transistors connected in series, and
      a load transistor connected in series to the decoding transistors and biased by a control voltage, for generating a selection signal for a memory word line; and
   a control circuit for controlling the load transistor by sensing when one memory word line is selected and when a plurality of word lines have been selected, and for producing the control voltage to bring the load transistor to a fully conductive state during a transition from one selected memory word line to a plurality of selected word lines.

6. A row selection/deselection circuit according to claim 5 wherein each of the plurality of decoding transistors comprises a same-conductivity-type transistor controlled by a respective selection signal, and wherein the load transistor comprises an opposite-conductive-type transistor.

7. A row selection/deselection circuit according to claim 5 wherein the control circuit comprises:
   a sensing element connected in series to the decoding transistors and to the load transistor for producing a sensing signal which switches between a first level when only one memory word line is selected and a second level when a plurality of memory word lines are selected;
   an inverter for receivng the sensing signal and outputting a first signal; and
   a high pass filter for receiving the first signal and producing the control voltage to bring the load transistor to a full conductive state when the sensing signal switches from the first level to the second level.

8. A row selection/deselection circuit according to claim 7, wherein the high pass filter comprises a compacitor coupled to a resistive load for producing the transient control voltage.

9. A row selection/deselection circuit according to claim 8, wherein the resistive load comprises a second load transistor biased in a state of conduction with a band-gap voltage.

10. A row selection/deselection circuit according to claim 7, wherein the sensing element comprises a transistor biased in state of conduction with a band-gap voltage.

11. A method for selecting/deselecting a row of a non-volatile memory, the method comprising:

connecting a decoding line between the voltage supply and the reference voltage, the decoding line comprising
 a plurality of decoding transistors connected in series, and
 a load transistor connected in series to the decoding transistors and biased by a control voltage, for generating a selection signal for a memory word line; and controlling the load transistor by sensing when one memory word line is selected and when a plurality of word lines have been selected, and by producing the control voltage to bring the load transistor to a fully conductive state during a transition from one selected memory word line to a plurality of selected word lines.

12. A method according to claim 11 wherein the load transistor is controlled by a control circuit comprising:

a sensing element connected in series to the decoding transistors and to the load transistors for producing a sensing signal which switches between a first level when only one memory word line is selected and a second level when a plurality of memory word lines are selected;

an inverter for receiving the sensing signal and outputting a first signal; and a high pass filter for receiving the first signal and producing the control voltage to bring the load transistor to a full conductive state when the sensing signal switches from the first level to the second level.

13. A method according to claim 12, wherein the high pass filter comprises a capacitor coupled to a resistive load for producing the transient control voltage.

14. A method according to claim 13, wherein the resistive load comprises a second load transistor biased in a state of conduction with a band-gap voltage.

15. A method according to claim 12, wherein the sensing element comprises a transistor biased in state of conduction with a band-gap voltage.

16. A method according to claim 11 wherein each of the plurality of decoding transistors comprises a same-conductivity-type transistor controlled by a respective selection signal, and wherein the load transistor comprises an opposite-conductivity-type transistor.

* * * * *

UNITED STATES PATENT AND TRADEMARK OFFICE
CERTIFICATE OF CORRECTION

PATENT NO. : 6,442,072 B2
DATED : August 27, 2002
INVENTOR(S) : Raffaele Solimene It is certified that error appears in the above-identified patent and that said Letters Patent is hereby corrected as shown below:

<u>Title page,</u>
Item [75], delete "STMicroelectronics S.R.L." insert -- STMicroelectronics S.r.l. --

<u>Column 1,</u>
Line 28, delete "correctly carry out the reading operations in a"

<u>Column 5,</u>
Line 64, delete "the"

<u>Column 6,</u>
Line 8, delete "element in" insert -- element connected in --
Line 12, delete "line" insert -- lines --
Line 64, delete "receivng" insert -- receiving --

<u>Column 7,</u>
Line 4, delete "compacitor" insert -- capacitor --

<u>Column 8,</u>
Line 4, delete "load transistors" insert -- load transistor --

Signed and Sealed this

Twenty-fifth Day of February, 2003

JAMES E. ROGAN
*Director of the United States Patent and Trademark Office*